US006947342B2

(12) United States Patent
Ishida et al.

(10) Patent No.: US 6,947,342 B2
(45) Date of Patent: Sep. 20, 2005

(54) SEMICONDUCTOR STORAGE DEVICE AND INFORMATION APPARATUS USING THE SAME

(75) Inventors: Terufumi Ishida, Nara (JP); Takahiro Nakai, Tenri (JP)

(73) Assignee: Sharp Kabushiki Kaisha, Abeno-Ku (JP)

( * ) Notice: Subject to any disclaimer, the term of this patent is extended or adjusted under 35 U.S.C. 154(b) by 257 days.

(21) Appl. No.: 10/183,700

(22) Filed: Jun. 25, 2002

(65) Prior Publication Data

US 2003/0021168 A1 Jan. 30, 2003

(30) Foreign Application Priority Data

Jun. 28, 2001 (JP) ........................................ 2001-197534

(51) Int. Cl.[7] ................................................ G11C 7/00
(52) U.S. Cl. .............. 365/203; 365/189.09; 365/230.06
(58) Field of Search ........................... 365/189.09, 203, 365/226, 227, 230.03, 230.06, 530

(56) References Cited

U.S. PATENT DOCUMENTS

| 5,177,707 A | | 1/1993 | Edme et al. | |
|---|---|---|---|---|
| 5,677,889 A | | 10/1997 | Haraguchi et al. | |
| 5,689,460 A | | 11/1997 | Ooishi | |
| 5,982,695 A | * | 11/1999 | Mukai | 365/226 |
| 6,373,763 B1 | * | 4/2002 | Taito et al. | 365/203 |
| 6,515,461 B2 | * | 2/2003 | Akiyama et al. | 323/313 |

FOREIGN PATENT DOCUMENTS

| EP | 0318094 | 5/1989 |
|---|---|---|
| JP | 59151389 | 8/1984 |
| JP | 4-252497 | 9/1992 |
| JP | 8-69693 | 3/1996 |
| JP | 2001-110184 | 4/2001 |

OTHER PUBLICATIONS

Derwent® English Abstract of Japanese Laid-Open Publication No. 4–252497 published on Sep. 8, 1992.
Derwent® English Abstract of Japanese Laid-Open Publication No. 8–069693 published on Mar. 12, 1996.

* cited by examiner

Primary Examiner—David Nelms
Assistant Examiner—Long Tran
(74) Attorney, Agent, or Firm—Morrison & Forester LLP

(57) ABSTRACT

A semiconductor storage device includes: a memory cell array including a plurality of memory cells which are connected to a plurality of pairs of complementary bit lines; an internal voltage decreasing section for generating a predetermined voltage lower than a power supply voltage; and an equalizing section for performing an equalizing operation to charge the pairs of complementary bit lines to a predetermined equal potential, wherein the internal voltage decreasing section is formed by first and second internal voltage decreasing sections, the equalizing section is formed by a first equalizing section, which is provided at one side of the memory cell array, and a second equalizing section, which is provided at the other side of the memory cell array, the first and second internal voltage decreasing sections supply an electric power to the first and second equalizing sections, respectively.

20 Claims, 9 Drawing Sheets

CONVENTIONAL ART

CONVENTIONAL ART

CONVENTIONAL ART

CONVENTIONAL ART

SEMICONDUCTOR STORAGE DEVICE AND INFORMATION APPARATUS USING THE SAME

BACKGROUND OF THE INVENTION

1. Field of the Invention

The present invention relates to a semiconductor storage device having a precharge/equalize function of charging bit lines to a predetermined equal potential before reading of information from a memory cell to bit lines, such as a static semiconductor storage device, a dynamic semiconductor storage device, or the like. The present invention also relates to an information apparatus using such a semiconductor storage device.

2. Description of the Related Art

In recent years, in semiconductor storage devices, an increase of storage capacity, a decrease of device size, and an increase of operational speed have been energetically promoted. This also applies to a static semiconductor storage device. As a method for increasing an operational speed, a bit line equalizing method is employed for a static semiconductor storage device having a pair of complementary bit lines BIT/BIT#. In this method, a selected pair of complementary bit lines BIT/BIT# are precharged before a data read operation, to an equal potential, for example, Vcc/2 when the power supply voltage is Vcc. At the time when the data read operation is started in response to this equalizing operation, a very small difference is caused in an output of a memory cell with respect to the precharged potential. This potential difference is amplified by a sense amplifier, whereby data stored in the memory cell is read out.

Thus, even when the very small potential difference between the pair of complementary bit lines BIT/BIT# is amplified for data reading, it is not necessary to make a full swing of (i.e., it is not necessary to largely change) the potentials of the pair of complementary bit lines BIT/BIT# up to the power supply potential or ground potential. As a result, the speed of the data read operation is increased.

Generally, in a bit line equalizing operation, bit lines are precharged to an intermediate potential which is lower than the power supply voltage Vcc, for example, precharged to Vcc/2. Thus, a semiconductor storage device which performs the equalizing operation must incorporate a voltage decreasing circuit for decreasing the potentials of the bit lines to Vcc/2.

A circuit structure of a conventional, commonly-employed static semiconductor storage device, which incorporates an equalizing circuit for performing the above equalizing operation, is shown in FIG. 8.

In FIG. 8, a conventional static semiconductor storage device 10 includes: an internal voltage decreasing circuit 1; a load transistor 2; a memory cell array 3 formed by a plurality of memory cells; a row decoder 4 for selecting among word lines; a column switch circuit 5 for controlling the on/off state of each bit line; a column decoder 6 for selecting among bit lines; a sense amplifier 7 for sensing memory data; an equalizing circuit 8 provided at one side of the memory cell array 3; and an equalizing circuit 9 provided at the other side of the memory cell array 3.

An input terminal of the internal voltage decreasing circuit 1 is connected to the power supply voltage Vcc. An output of the internal voltage decreasing circuit 1, Vccin, is supplied to the row decoder 4 and the equalizing circuits 8 and 9 (hereinafter, referred to as "EQ circuits 8 and 9"), and also supplied to the memory cell array 3 via the load transistor 2 and pairs of complementary bit lines BL1/BL1# through BLn/BLn#. Further, the output Vccin of the internal voltage decreasing circuit 1 is supplied via the EQ circuit 9 to the pair of complementary bit lines BL1/BL1# through BLn/BLn#, and on the other hand, is supplied via the EQ circuit 8 to pairs of complementary node lines SEN1/SEN1# through SENn/SENn#.

In order to prevent a pair of complementary bit lines from being placed in a floating state, a very small amount of electric current is always allowed to flow through the load transistor 2. As shown in FIG. 9, the load transistor 2 includes a plurality of PMOS transistors P1 and P2. In order to constantly place the PMOS transistors P1 and P2 in a conductive state, gates of the PMOS transistors P1 and P2 are connected to the ground potential; sources of the PMOS transistors P1 and P2 are connected to the output of the internal voltage decreasing circuit 1; and the drains of the PMOS transistors P1 and P2 are connected to the pairs of complementary bit lines BL1/BL1# through BLn/BLn# and also connected through these bit lines to the EQ circuit 9.

The memory cell array 3 includes a plurality of memory cells 3a. The plurality of memory cells 3a are provided at intersections of the pairs of complementary bit lines BL1/BL1# through BLn/BLn# and word lines WL1 through WLn in a matrix pattern.

The row decoder 4 sequentially selects among the word lines WL1 through WLn based on a result of decoding of an address.

The column switch circuit 5 is provided between a pair of complementary bit lines BLi/BLi# and a pair of complementary node lines SENi/SENi# (where i denotes a natural number selected from 1 to n). The column switch circuit 5 is formed by transfer circuits 5a and 5b. The transfer circuits 5a and 5b control the on/off state of the connection between the pair of complementary bit lines BLi/BLi# and the pair of complementary node lines SENi/SENi#. Specifically, as shown in FIG. 10, the transfer circuit 5a includes a PMOS transistor P6 and an NMOS transistor N3. In response to a bit line selection signal from the column decoder 6, the PMOS transistor P6 and the NMOS transistor N3 are both turned on/off, whereby the pairs of complementary bit lines BL1/BL1# through BLn/BLn# are connected to or disconnected from the sense amplifier 7. In this way, the transfer circuit 5a selects among the bit lines.

The column decoder 6 drives and controls each transfer circuit of the column switch circuit 5 based on a result of decoding of an address.

The sense amplifier 7 amplifies a potential variation generated in an output of a memory cell 3a and detects the amplified potential variation, thereby reading information from the memory cell 3a.

The EQ circuit 8 has a function of precharging the pair of complementary bit lines BLi/BLi# to an equal potential and of equalizing the potentials of the pair of complementary bit lines BLi/BLi#. An output terminal of the EQ circuit 8 and an output terminal of the load transistor 2 is connected to the pair of complementary bit lines BLi/BLi# in parallel.

The EQ circuit 9 is connected between the column switch circuit 5 and the sense amplifier 7. The EQ circuit 9 has a function of precharging and equalizing the pair of complementary node lines SENi/SENi# provided at the side of the sense amplifier 7. An example of a circuitry structure of the EQ circuit 9 is shown in FIG. 11.

As shown in FIG. 11, the EQ circuit 9 includes P-type MOS transistors P3 to P5. Sources and back gates of the P-type MOS transistors P3 and P4 are connected to the output terminal Vccin of the internal voltage decreasing circuit 1. A drain of the P-type MOS transistor P3 is connected to a node line SENi which is connected to an output terminal of the column switch circuit 5. A drain of the P-type MOS transistor P4 is connected to a node line SENi# which is connected to another output terminal of the column switch circuit 5. The pair of complementary node lines SENi/SENi# are connected through the column switch circuit 5 to the pair of complementary bit lines BLi/BLi#, respectively. Further, in order to equalize the pair of complementary node lines SENi/SENi#, a source and a drain of the P-type MOS transistor P5 are connected between the complementary node lines SENi/SENi#. A back gate of the P-type MOS transistor P5 is connected to the output terminal Vccin of the internal voltage decreasing circuit 1. Furthermore, an equalizing signal EQ# output from an internal timing circuit (not shown in FIG. 11) is supplied to the gates of the P-type MOS transistors P3 to P5. During a period when the equalizing signal EQ# is at a low level, the P-type MOS transistors P3 to P5 are all conducted. As a result, the pair of the complementary node lines SENi/SENi# are precharged by the P-type MOS transistors P3 and P4 to a voltage level of the output Vccin (e.g., Vcc/2), and the voltages of the pair of the complementary node lines SENi/SENi# are equalized by the P-type MOS transistor P5.

In the above operation, lines which have to be precharged and equalized in order to read information from a selected memory cell 3a are the pair of complementary bit lines BL1/BL1# through BLn/BLn#, and the pair of the complementary node lines SENi/SENi# which are selected by the column decoder 6 and connected to the transfer circuits 5a and 5b of the column switch circuit 5. In the conventional example shown in FIG. 8, these lines are precharged and equalized only by the output Vccin of the internal voltage decreasing circuit 1.

Further, a similar technique of increasing an operational speed of a storage device using an internal voltage decreasing circuit, which generates a voltage lower than the power supply voltage, is proposed in Japanese Laid-Open Publication No. 4-252497, entitled "Nonvolatile Semiconductor Storage Device". Referring to FIG. 12, this nonvolatile semiconductor storage device includes an internal voltage decreasing circuit 1 which generates a voltage lower than the power supply voltage. The internal voltage decreasing circuit 1 applies a low voltage to a load transistor 2 which is connected to a sense amplifier 7. The sense amplifier 7 is used to detect a variation in the potentials of the bit lines BL1, BL1#, . . . , BLn, and BLn#, which are connected to the load transistor 2, whereby information is read from a memory cell. With such an arrangement, the sensitivity of a read current from a memory cell is increased, whereby a non volatile semiconductor storage device with an increased access speed can be obtained.

Furthermore, another example of a semiconductor storage device incorporating an internal voltage decreasing circuit, which is illustrated in FIGS. 13 and 14, is proposed in Japanese Laid-Open Publication No. 8-69693, entitled "Static semiconductor Storage Device".

Referring to FIG. 13, this static semiconductor storage device uses an internal voltage decreasing circuit 1 to decrease an externally supplied power supply voltage Vcc so as to output a potential lower than the power supply voltage Vcc to a peripheral circuit(s). As a result, the externally supplied power supply voltage Vcc is directly applied to a static memory cell, so that the operational voltage of a memory cell array 3 is relatively increased. Thus, even when the amount of consumed electric power is small, an ON-current of a transistor in a memory cell appears to be increased. As a result, a static semiconductor storage device, where the stability in a memory cell read operation is increased, can be obtained.

Furthermore, in a static semiconductor storage device shown in FIG. 14, an output of an internal voltage decreasing circuit 1, i.e., a potential lower than the power supply voltage, is applied to a peripheral circuit section. Moreover, when data is read from a static memory cell array 3, a potential higher than the power supply potential Vcc is applied by an internal voltage increasing circuit 1A to the static memory cell array 3. In such an arrangement, an operational voltage of the memory cell array 3 is further increased only during the read operation, and an ON-current of a transistor in a memory cell appears to be increased. As a result, a static semiconductor storage device, where the stability in a memory cell read operation is increased even though the amount of consumed electric power is small, can be obtained.

In the above-described conventional structure, a low voltage decreased by the internal voltage decreasing circuit 1 is applied to the pairs of complementary bit lines BL1/BL1# through BLn/BLn#, and a potential variation generated in the pairs of complementary bit lines BL1/BL1# through BLn/BLn# due to an output of the memory cell 3a is detected using the sense amplifier 7, whereby information is read from the memory cell 3a. In the case of such a structure, the internal voltage decreasing circuit 1 must have a capacity for providing a voltage and electric current at a level sufficient for precharging the pairs of complementary bit lines BL1/BL1# through BLn/BLn#, and a capacity for securing a stable operation of the sense amplifier 7. Moreover, in a precharge period, a large amount of electric current is allowed to momentarily flow for the purpose of precharging a pair of complementary bit lines, and accordingly, the voltage is momentarily decreased. A commonly employed measure for preventing such a decrease in voltage is connecting an element having a capacitance, such as a capacitor, to an output terminal of the internal voltage decreasing circuit 1 which functions as a power supply. Thus, in order to secure stability in an operation which is performed in the presence of a large electric current load, such as a precharge operation, it is necessary to provide a sufficiently large capacitive element. However, in order to secure a large capacitance in such a capacitive element, a large device area (chip area) must be provided.

In the conventional structure shown in FIG. 8, in an operation of reading information from a selected memory cell 3a, correct information cannot be read out before precharging and equalizing of the pair of the complementary node lines SENi/SENi#, which are connected to the sense amplifier 7 via the column switch 5 selected by the column decoder 6, are completed. Further, this entire operation is performed using a voltage and electric current supplied from the internal voltage decreasing circuit 1. Thus, the voltage/current driving ability of the internal voltage decreasing circuit 1 adversely influences the time required for the precharging and equalizing operations, i.e., an increase in the speed of a data read operation. Therefore, as a driving ability of the internal voltage decreasing circuit 1 is decreased, the speed of reading data from the selected memory cell 3a is decreased. In view of such a correlation, in order to increase the data read speed, the circuit size of the internal voltage decreasing circuit 1 must be necessarily increased. These problems are especially significant in consideration of a decrease in the power supply voltage which has been achieved in recent years.

SUMMARY OF THE INVENTION

According to one aspect of the present invention, a semiconductor storage device includes: a memory cell array including a plurality of memory cells, the memory cells being connected to a plurality of pairs of complementary bit lines; an internal voltage decreasing section for generating a predetermined voltage which is lower than a power supply voltage; and an equalizing section to which the predetermined voltage is supplied from the internal voltage decreasing section, and which performs an equalizing operation to charge the pairs of complementary bit lines to a predetermined equal potential before reading of information from the memory cells to the pairs of complementary bit lines, wherein the internal voltage decreasing section is formed by a first internal voltage decreasing section and a second internal voltage decreasing section, the equalizing section is formed by a first equalizing section, which is provided at one side of the memory cell array, and a second equalizing section, which is provided at the other side of the memory cell array, the first internal voltage decreasing section supplies an electric power to the first equalizing section, and the second internal voltage decreasing section supplies an electric power to the second equalizing section.

In one embodiment of the present invention, the semiconductor storage device further includes: a row selection section for selecting, according to a row selection signal, memory cells in a specific row of the memory cell array which includes the plurality of memory cells connected to a plurality of pairs of complementary bit lines, and reading information from the specific memory cells to the plurality of pairs of complementary bit lines; and a column selection section for controlling a connection of a certain pair of complementary bit lines, which is selected among the plurality of pairs of complementary bit lines according to a column selection signal, to an amplification section which is used for reading information from the memory cells, wherein the first equalizing section is provided between the column selection section and the amplification section.

In another embodiment of the present invention, among the first and second voltage decreasing sections, only the first voltage decreasing section has a stabilization circuit which is used for supply of an electric current.

In still another embodiment of the present invention, the capacitance of a capacitor section included in the stabilization circuit is smaller than that of a capacitor section included in the internal voltage decreasing section.

In still another embodiment of the present invention, the first voltage decreasing section includes: an output series circuit for extracting an output voltage from a connection point between a first voltage decreasing driver section and a capacitor section; and a driver control section for amplifying a difference voltage between the output voltage and a reference voltage, and for controlling the first voltage decreasing driver section using the amplified output voltage.

In still another embodiment of the present invention, the first voltage decreasing section includes: a latter stage voltage decreasing section including a first output series circuit for extracting an output voltage from a connection point between a first voltage decreasing driver section and a capacitor section, and a first driver control section for amplifying a difference voltage between the output voltage and a first reference voltage, and for controlling the first voltage decreasing driver section using the amplified output voltage; and a former stage voltage decreasing section including a second output series circuit for employing an output voltage from a connection point between a second voltage decreasing driver section and a resistance section as the first reference voltage, and a second driver control section for amplifying a difference voltage between the first reference voltage and a second reference voltage, and for controlling the second voltage decreasing driver section using the amplified output voltage.

In still another embodiment of the present invention, the second voltage decreasing section is formed by a circuit exclusively used for charging.

In still another embodiment of the present invention, the circuit exclusively used for charging includes: a third voltage decreasing driver section for charging the bit lines; and a driver control section for monitoring a bit line voltage charged by the third voltage decreasing driver, and for controlling the third voltage decreasing driver section such that charging is stopped when the bit line voltage reaches a predetermined bit line voltage.

According to another aspect of the present invention, there is provided an information apparatus which performs a memory processing operation using the semiconductor storage device of the present invention.

Herein, a function of the above structure of the present invention is described.

According to the present invention, an internal voltage decreasing section is divided into two lines of power supply circuits, i.e., a first voltage decreasing section and a second voltage decreasing section. An equalizing section is divided into a first equalizing section, which is provided at one side of a memory cell array, and a second equalizing section, which is provided at the other side of the memory cell array. The first voltage decreasing section supplies electric power to the first equalizing section, and the second voltage decreasing section supplies electric power to the second equalizing section. In such a structure, a pair of bit lines are precharged and equalized by the two lines of power supply circuits. In the first voltage decreasing section, it is only necessary to precharge and equalize a pair of bit lines which are selected at the time of reading of data by a column selection section used for reading information from a memory cell. Thus, the amount of a supplied electric current is significantly smaller than in a conventional internal voltage decreasing circuit, even though it is still necessary to provide a stabilization circuit used for preventing information noise. Further, in the second voltage decreasing section, all the pairs of the bit lines, including unselected bit lines, are precharged and equalized. It is not necessary to provide a stabilization circuit for preventing noise, which is provided in a conventional internal voltage decreasing circuit, and the second voltage decreasing section can do only with an exclusively provided charging circuit.

In a conventional internal voltage decreasing circuit, all the bit lines are precharged and equalized only by a single line of circuitry. Thus, an electric current load is large, and it is necessary to use a large capacitor as a stabilization circuit of the conventional internal voltage decreasing circuit, and to use a large driving element for supplying an electric current. On the other hand, however, according to the present invention, the circuit size of the first voltage decreasing section (especially, the capacitance of a capacitor used as a stabilization circuit) can be significantly reduced in comparison to that of a conventional voltage decreasing section. Accordingly, a significant reduction in the size of a semiconductor chip can be achieved. Since the capacitance of the capacitor of the first voltage decreasing section is significantly decreased, and it is not necessary to provide an output capacitor in the second voltage decreasing section, the speed of an operation of precharging and equalizing a pair of bit lines can be increased.

Thus, the invention described herein makes possible the advantages of: (1) providing a static semiconductor storage device capable of achieving a high speed memory operation by precharging and equalizing a pair of bit lines at a higher speed while an increase in the circuit size of an internal voltage decreasing circuit is suppressed; and (2) providing an information apparatus using such a static semiconductor storage device.

These and other advantages of the present invention will become apparent to those skilled in the art upon reading and understanding the following detailed description with reference to the accompanying figures.

DESCRIPTION OF THE PREFERRED EMBODIMENTS

Hereinafter, an embodiment of the present invention where the principle of the present invention is applied to a static semiconductor storage device is described with reference to the drawings.

Figure 1:
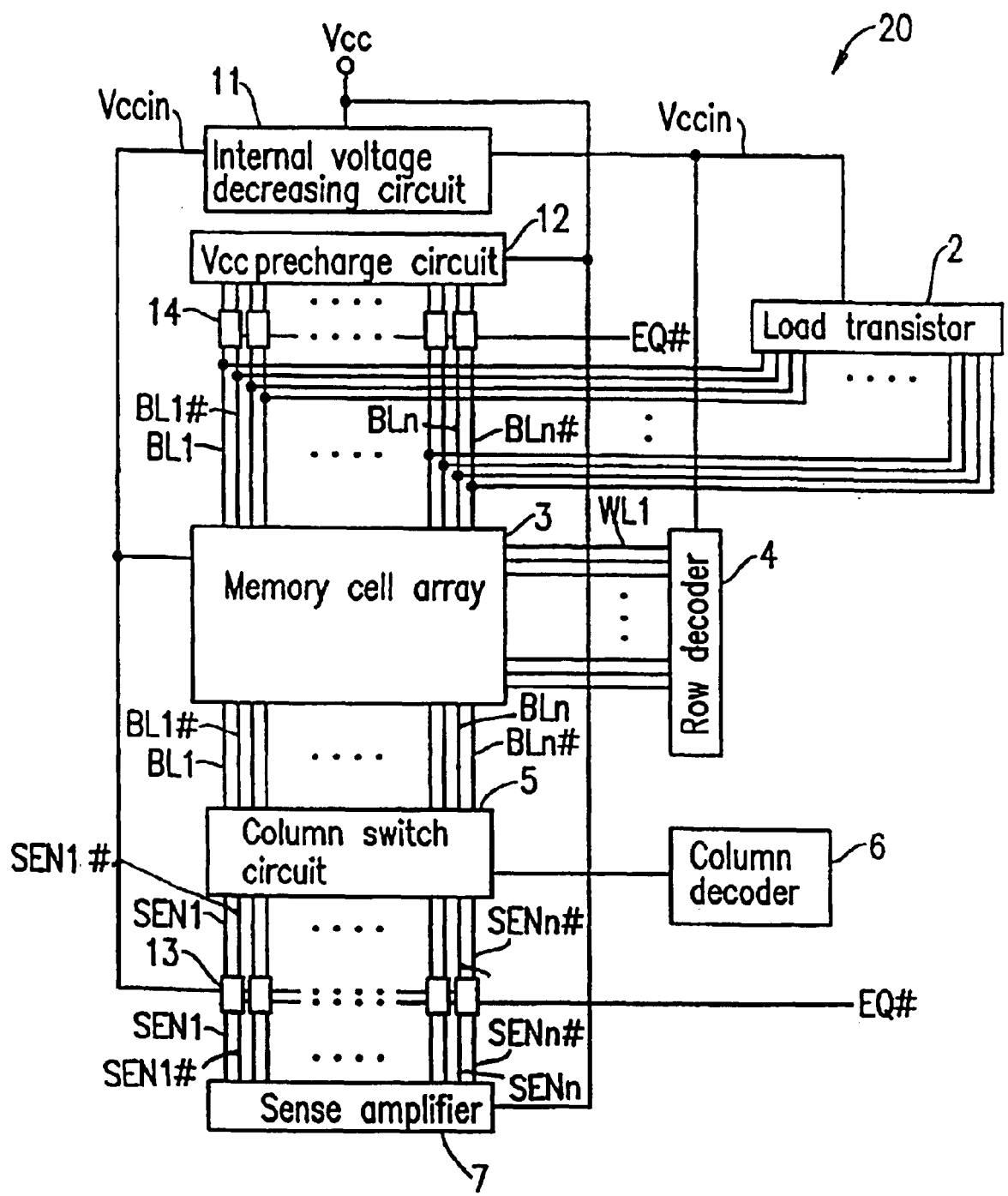
FIG. 1 is a block diagram showing an exemplary structure of a primary portion of a static semiconductor storage device according to an embodiment of the present invention.

FIG. 1 is a block diagram showing a primary part of a static semiconductor storage device according to an embodiment of the present invention. In FIG. 1, like elements which produce the same effects are indicated by like reference numerals used in FIG. 8, and detailed descriptions thereof are omitted.

Figure 8:
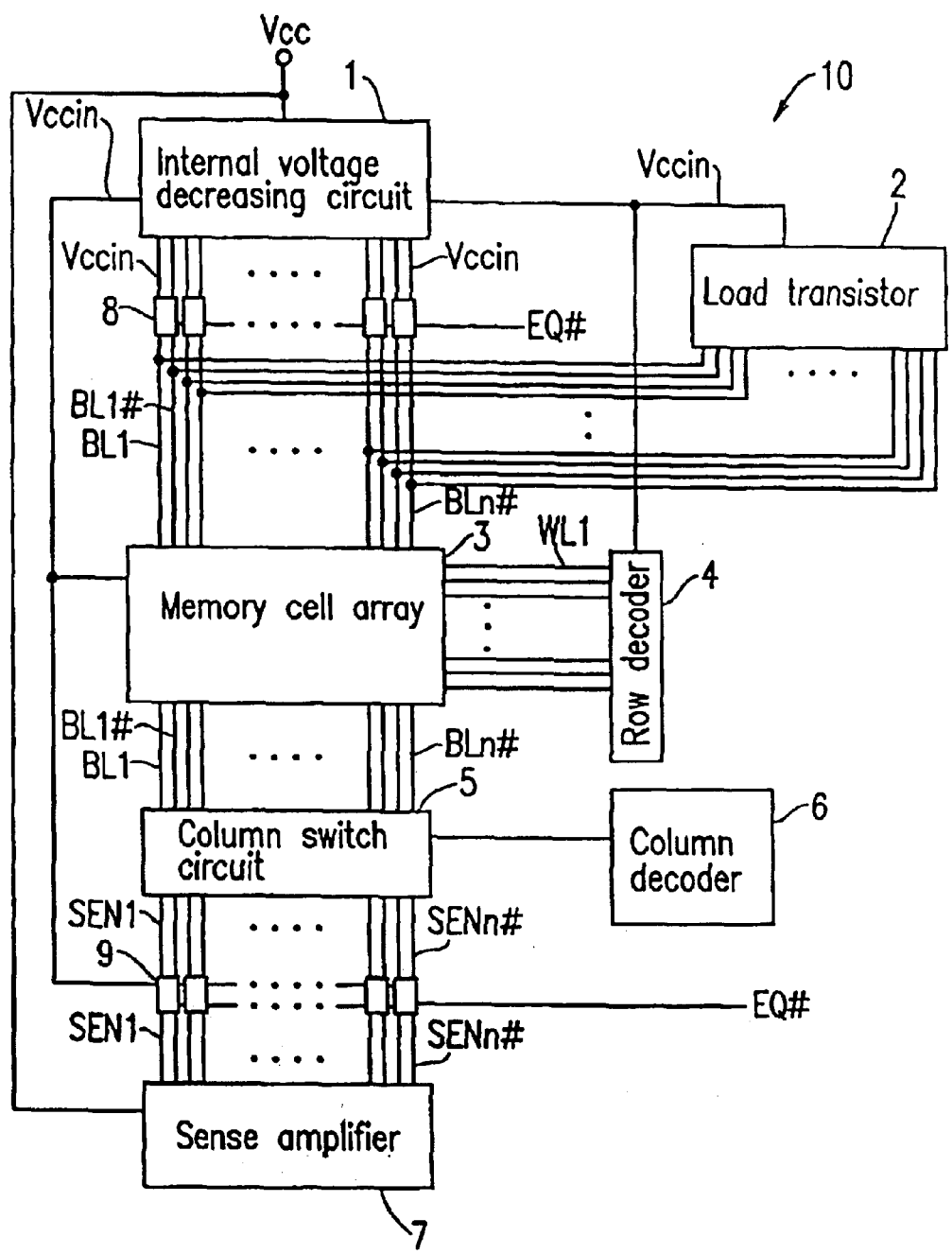
FIG. 8 is a block diagram showing an exemplary structure of a primary portion of a conventional static semiconductor storage device.

In FIG. 1, the static semiconductor storage device 20 includes: an internal voltage decreasing circuit 11 as a first voltage decreasing section; a Vcc precharge circuit 12 as a second voltage decreasing section; an equalizing circuit 13 (hereinafter, "EQ circuit 13") as a first equalizing section, to which an output terminal of the internal voltage decreasing circuit 11 is connected; and equalizing circuits 14 (hereinafter, "EQ circuits 14") as a second equalizing section, to which an output terminal of the Vcc precharge circuit 12 is connected. A feature of the present invention resides in that the internal voltage decreasing circuit 1 of FIG. 8 is divided into: the internal voltage decreasing circuit 11, which has a device performance smaller than that of the internal voltage decreasing circuit 1 and which incorporates a capacitor (stabilization circuit) having a capacitance significantly smaller than that of the internal voltage decreasing circuit 1; and the Vcc precharge circuit 12 which is a circuit exclusively employed for precharging all the pairs of complementary bit lines. This feature of the present invention is described below in detail.

Power supply voltage Vcc is input to the internal voltage decreasing circuit 11. An output terminal of the internal voltage decreasing circuit 11 (output voltage Vccin) is connected to the load transistor 2, the row decoder (row selection section) 4, the memory cell array 3, and the EQ circuit 13 which precharges and equalizes a pair of complementary node lines.

The internal voltage decreasing circuit 11 is described in detail. The internal voltage decreasing circuit 11 decreases the externally supplied power supply voltage Vcc to a predetermined voltage (e.g., Vcc/2), so as to output a voltage lower than the power supply voltage Vcc from the output terminal Vccin. Further, the internal voltage decreasing circuit 11 incorporates a capacitor C (FIG. 2) connected between an output terminal Out of the internal voltage decreasing circuit 11 and a ground terminal. The capacitor C is provided for preventing generation of noise, and a voltage decrease in an output level which is caused due to an instantly consumed current, in order to achieve a stable operation of the internal voltage decreasing circuit 11. This capacitor C is capable of achieving a stable operation of the internal voltage decreasing circuit 11 with a very small capacitance, in comparison to the capacitance of a capacitor required for the conventional internal voltage decreasing circuit 1 to operate in a stable manner. Thus, according to the present invention, a layout penalty for a semiconductor chip can be significantly reduced. According to the present invention, a precharge operation current is supplied from the Vcc precharge circuit 12 to all the pairs of bit lines (e.g., 256 bit lines), which are considered to consume a largest portion of the electric current supplied from the internal voltage decreasing circuit 1 in a conventional storage device. Thus, the internal voltage decreasing circuit 11 is only required to supply a precharge operation current to a selected bit line (e.g., 1 bit line). As a result, the current driving ability can be significantly reduced in comparison to that of the conventional internal voltage decreasing circuit 1. In general, the capacitance of the capacitor C which is required for achieving a stable operation of an internal voltage decreasing circuit is proportional to the current driving ability of the internal voltage decreasing circuit. In view of this, a significantly small capacitance of the capacitor C is sufficient for the internal voltage decreasing circuit 11 in comparison to the conventional internal voltage decreasing circuit 1 (e.g., 1/256). Accordingly, a layout area (chip area) of a storage device can be significantly reduced. An operation stabilizing circuit is formed by the capacitor C or by a circuit including the capacitor C, and is provided at the output terminal of the internal voltage decreasing circuit 11.

In the case where the capacitance of the capacitor C is greater than 1/256, the internal voltage decreasing circuit 11 can operate in a more stable manner, even in the presence of a "swing" of a bit line voltage, in comparison to the conventional internal voltage decreasing circuit 1. However, as the capacitance of the capacitor C increases, the charging speed for a pair of bit lines decreases. A value of the capacitance of the capacitor C maybe set so as to be within a value range which is determined in view of the layout of a semiconductor chip. Alternatively, a value of the capacitance of the capacitor C may be set so as to be within a value range determined in view of the operational speed, such as data read speed, such that charging of a pair of bit lines is completed within a very short time interval.

Figure 2:
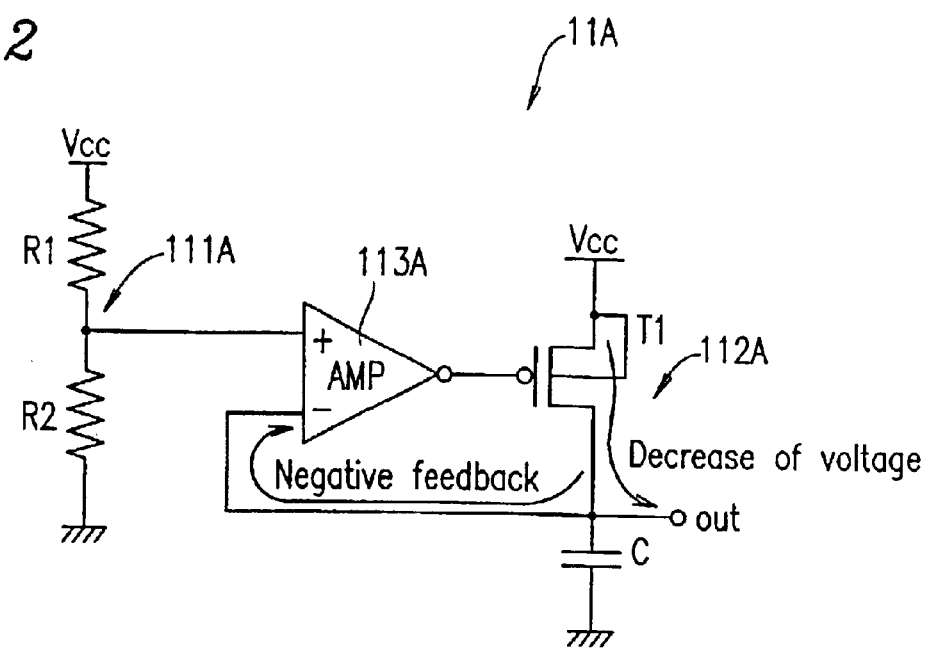
FIG. 2 is a circuit diagram showing an example of an internal voltage decreasing circuit of FIG. 1.
Figure 3:
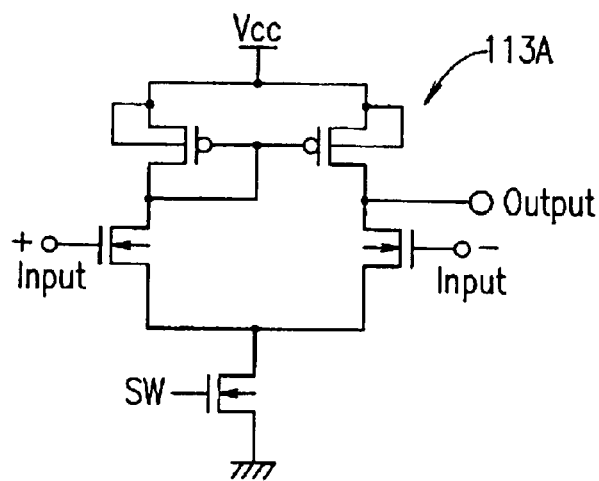
FIG. 3 is a circuit diagram showing an example of a differential amplifier of FIG. 2.

A particular example of the internal voltage decreasing circuit 11A is shown in FIG. 2. In FIG. 2, an internal voltage decreasing circuit 11A includes a reference voltage generation series circuit 111A, an output series circuit 112A, and a differential amplifier 113A (differential amplifying section AMP) which functions as a driver control section. The reference voltage generation series circuit 111A is formed by resistance sections R1 and R2 provided between the power supply Vcc and a ground. The output series circuit 112A which is provided between the power supply Vcc and a ground and which extracts an output voltage from a connection point between a PMOS transistor (first voltage decreasing driver section) T1 and a capacitor (capacitor section or capacitance section) C. In the differential amplifier 113A, an output level (output voltage) of an output terminal Out, which is connected to the connection point between the PMOS transistor T1 and the capacitor C, is fed back to a negative input terminal. A reference voltage at a connection point between the resistance sections R1 and R2 (which is an intermediate potential Vcc/2 to be output from the output terminal Out) is input to a positive input terminal. An output terminal of the differential amplifier 113A, from which an amplified difference voltage between the output voltage of the differential amplifier 113A and the reference voltage (intermediate potential Vcc/2) is output, is connected to a gate of the PMOS transistor T1. In this internal voltage decreasing circuit 11A, an output voltage decreased by the PMOS transistor T1 is output from the output terminal Out, and this output voltage level is fed back to the differential amplifier 113A. At the time when the difference between the fed-back actual output voltage level and an intended output voltage value (i.e., intermediate potential Vcc/2) is eliminated, the PMOS transistor T1 is turned off by the output of the differential amplifier 113A, whereby a decrease in the output voltage from the output terminal Out is stopped at a predetermined voltage (the intended output voltage value, i.e., intermediate potential Vcc/2). A particular internal structure of the differential amplifier 113A is shown in FIG. 3. In this structure, a differential amplification operation is started in response to a turn-on of a switching transistor (switching section) SW, and a difference voltage between a voltage input to a positive input terminal and a voltage input to a negative input terminal is amplified and output from an output terminal Output. In the differential amplifier 113A, the output voltage from the output terminal Output is inverted and input to a gate of the PMOS transistor T1.

Figure 9:
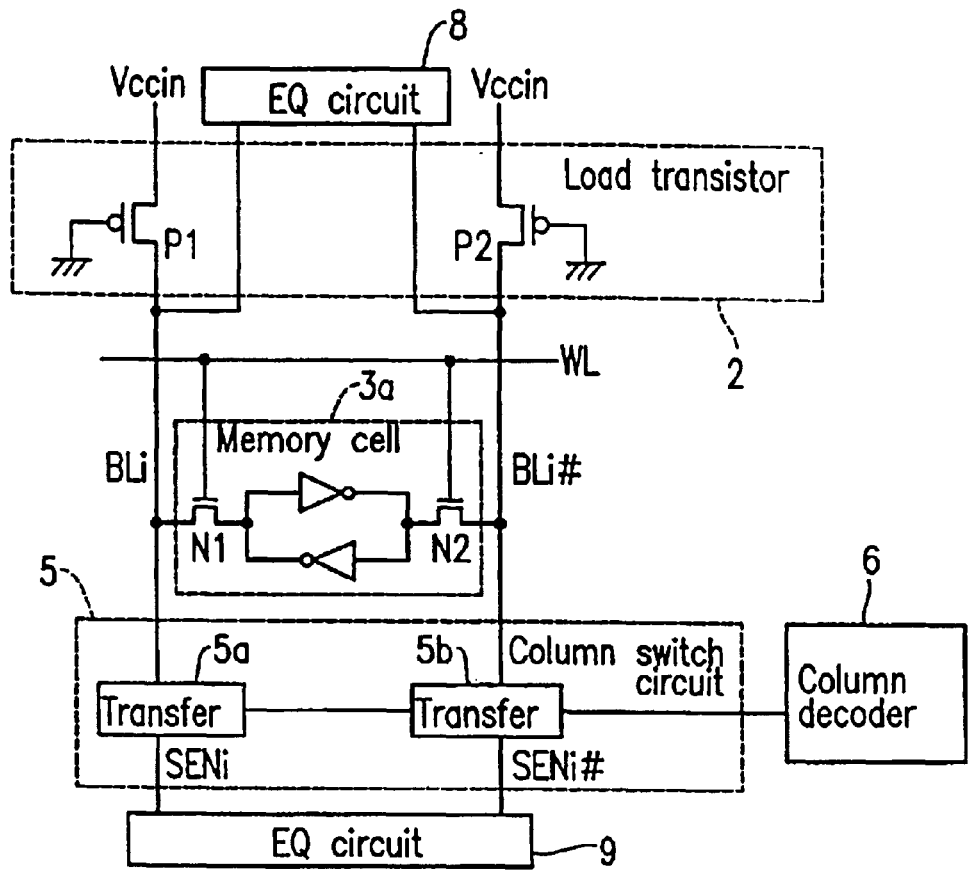
FIG. 9 is a circuit diagram showing a memory cell and peripheral circuits in a conventional static semiconductor storage device.

The Vcc precharge circuit 12 is a charging circuit which receives the power supply voltage Vcc and outputs, for example, an intermediate potential Vcc/2 as an output voltage. Output terminals of the Vcc precharge circuit 12 are connected via the EQ circuits 14 to the pairs of complementary bit lines BL1/BL1# through BLn/BLn# which are connected to the memory cell array 3. Furthermore, the Vcc precharge circuit 12 is a circuit exclusively used for a precharge operation. The level of an output voltage of the Vcc precharge circuit 12 is a level which does not exceed the withstand voltage of the memory cell 3a (FIG. 9) and which is sufficient for preventing erroneous writing of data in the memory cell 3a which is selected for reading data therefrom. The Vcc precharge circuit 12 has a considerably simplified structure for the purpose of supporting a precharge operation performed by the internal voltage decreasing circuit 11.

The Vcc precharge circuit 12 precharges the pairs of complementary bit lines BL1/BL1# through BLn/BLn# with a precharge voltage Vpre, which does not exceed the withstand voltage of the memory cell 3a and which is sufficient for preventing erroneous writing of data in the memory cell 3a which is selected for reading data therefrom. If the pairs of complementary bit lines BL1/BL1# through BLn/BLn# are not precharged before reading of data, at the time of selection among the word lines WL, a latch data in a latch circuit section of the memory cell 3a (FIG. 9) would be inverted (i.e., erroneously written) due to a bit line voltage applied during a previous selection of a word line. In order to prevent such an erroneous writing operation in the memory cell 3a, considering that the pairs of complementary bit lines BLi/BLi# are already equalized at the time of a precharge operation, the potential of the pairs of complementary bit lines BLi/BLi# are set to be equal to or higher than a threshold voltage of a memory cell transistor (about 0.4 V to 0.5 V). In such a case, the latch data (one of the pair of bit lines is "0", the other is "1") in the latch circuit section (inverter section) of the memory cell 3a is not inverted (i.e., erroneously written). The precharge voltage Vpre is set so as to be within a voltage range from about 0.4 V to 2.7 V, because the precharge voltage Vpre should not exceed the withstand voltage of the memory cell transistor of the memory cell 3a (about 2.5 V to 2.7 V). The thus-set precharge voltage Vpre is applied to the pairs of complementary bit lines BL1/BL1# through BLn/BLn# via the EQ circuits 14. In response to an equalizing signal EQ#, the EQ circuits 14 precharge and equalize all of the pairs of complementary bit lines BL1/BL1# through BLn/BLn# connected to the EQ circuits 14.

A particular example of the Vcc precharge circuit 12 is now described. In a precharge circuit 12A shown in FIG. 4, an output terminal Y of a driver section (third driver section) T121A used for decreasing a voltage (hereinafter, "voltage decreasing driver section T121A") is connected to each of the pairs of complementary bit lines BL1/BL1# through BLn/BLn#, via an equivalent circuit shown in a broken box X. Herein, a single transistor which is provided for decreasing a voltage (hereinafter, "voltage decreasing transistor") also functions as a transistor used for charging (hereinafter, "charging transistor"). The output terminal Y of the voltage decreasing driver section T121A is also connected to a control terminal of the voltage decreasing driver section T121A via a time constant circuit which includes an equivalent circuit Z. The equivalent circuit Z has an electric current capacitance of an amount which is equivalent to (or a small amount proportional to) that of the equivalent circuit X of each of the pairs of complementary bit lines BL1/BL1# through BLn/BLn#. The equivalent circuit Z can be formed by a serial transistor circuit having a predetermined capacitance value and resistance value. In such a structure, a charging current of an amount equal to (or a small amount proportional to) that of a charging current applied to the pairs of complementary bit lines BL1/BL1# through BLn/BLn# is input to the control terminal of the voltage decreasing driver section T121A via the time constant circuit (equivalent circuit Z). At the time when the input voltage to that control terminal reaches a predetermined voltage (a voltage to turn off a transistor), power supply from the voltage decreasing driver section T121A is shut off. In this case, an increase of a control voltage, which is input to the control terminal, is adjusted such that the voltage decreasing driver section T121A is turned off (or suppresses supply of an electric current) at the time when the increasing voltage at the pairs of complementary bit lines BL1/BL1# through BLn/BLn# reaches the precharge voltage Vpre. With the above structure, the bit line voltage can be set to the precharge voltage Vpre correctly. Furthermore, the bit line voltage can be increased to the precharge voltage Vpre more quickly. By resetting the voltage of the control terminal, the voltage decreasing driver section T121A is turned on (i.e., activated), and precharging of all the bit lines is started.

Figure 10:
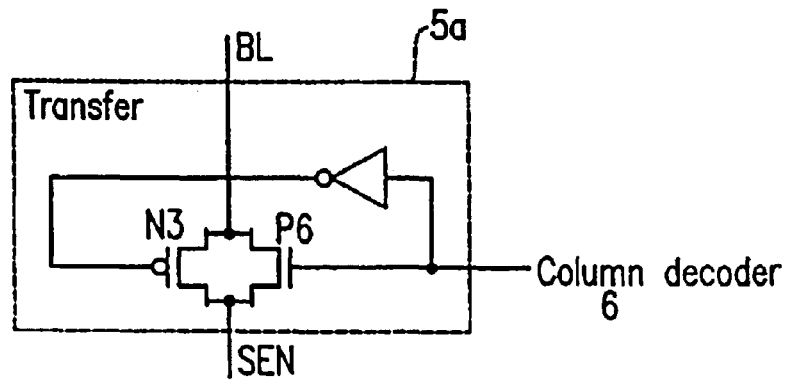
FIG. 10 is a circuit diagram showing a transfer circuit of a conventional column switch circuit.
Figure 11:
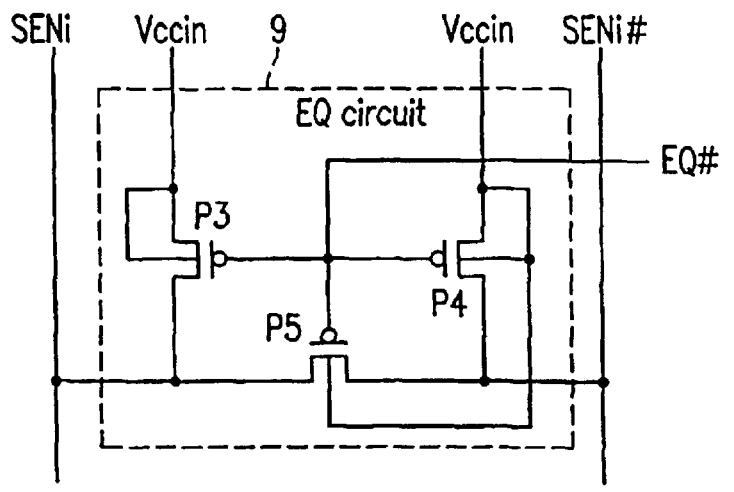
FIG. 11 is a circuit diagram showing a conventional example of an EQ circuit.
Figure 12:
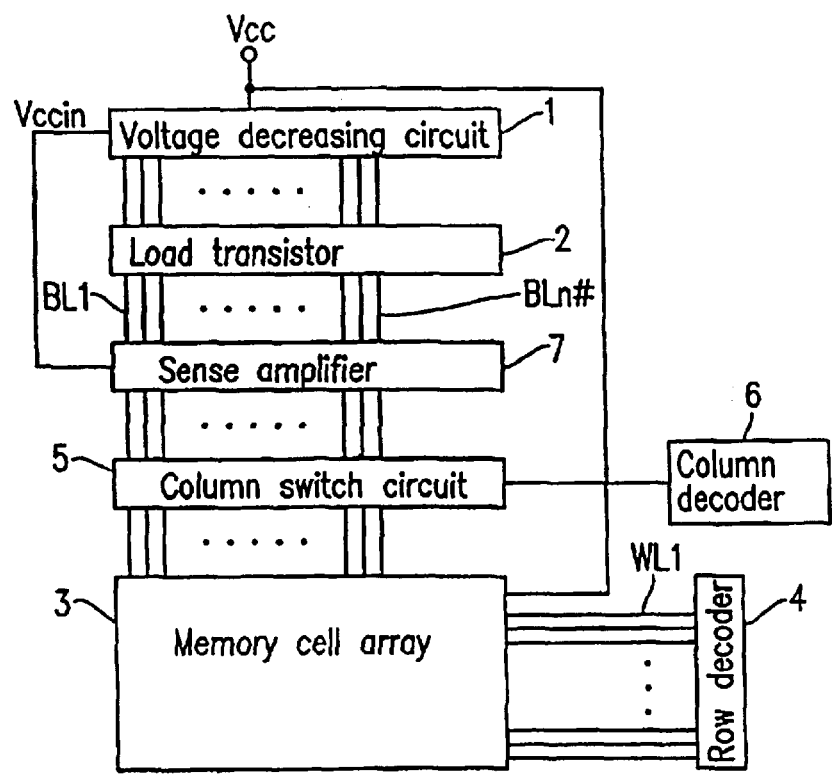
FIG. 12 is a block diagram showing an exemplary structure of a primary portion of a conventional nonvolatile semiconductor storage device disclosed in Japanese Laid-Open Publication No. 4-252497.
Figure 13:
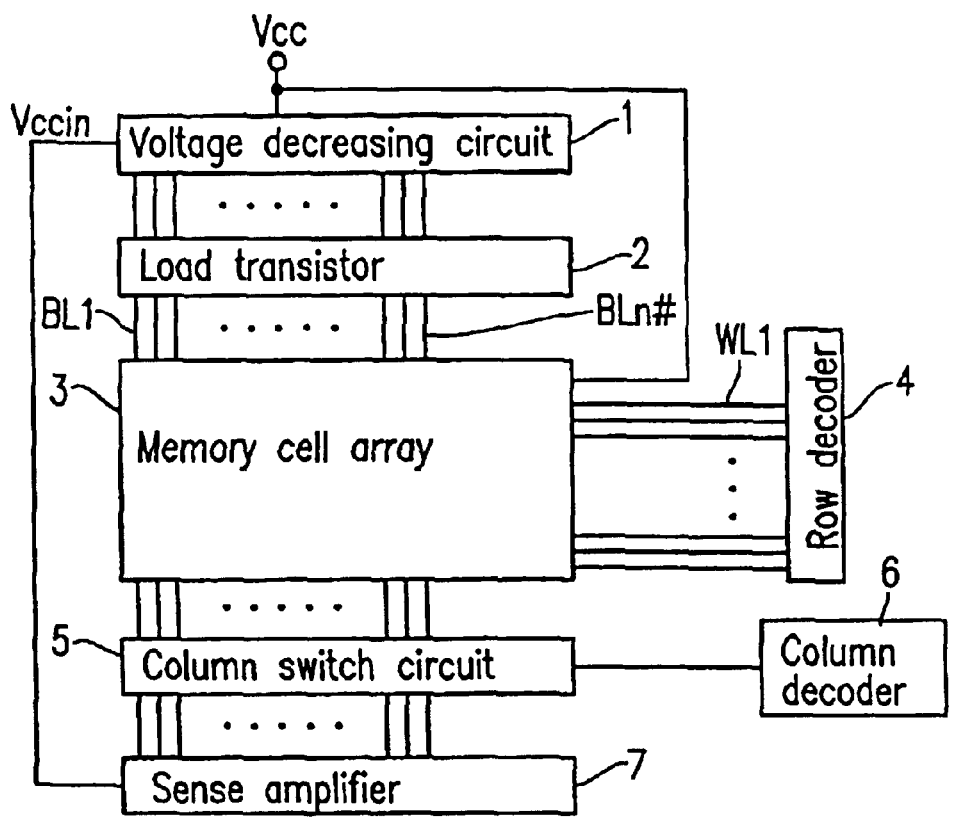
FIG. 13 is a block diagram showing an exemplary structure of a primary portion of a conventional static semiconductor storage device disclosed in Japanese Laid-Open Publication No. 8-69693.
Figure 14:
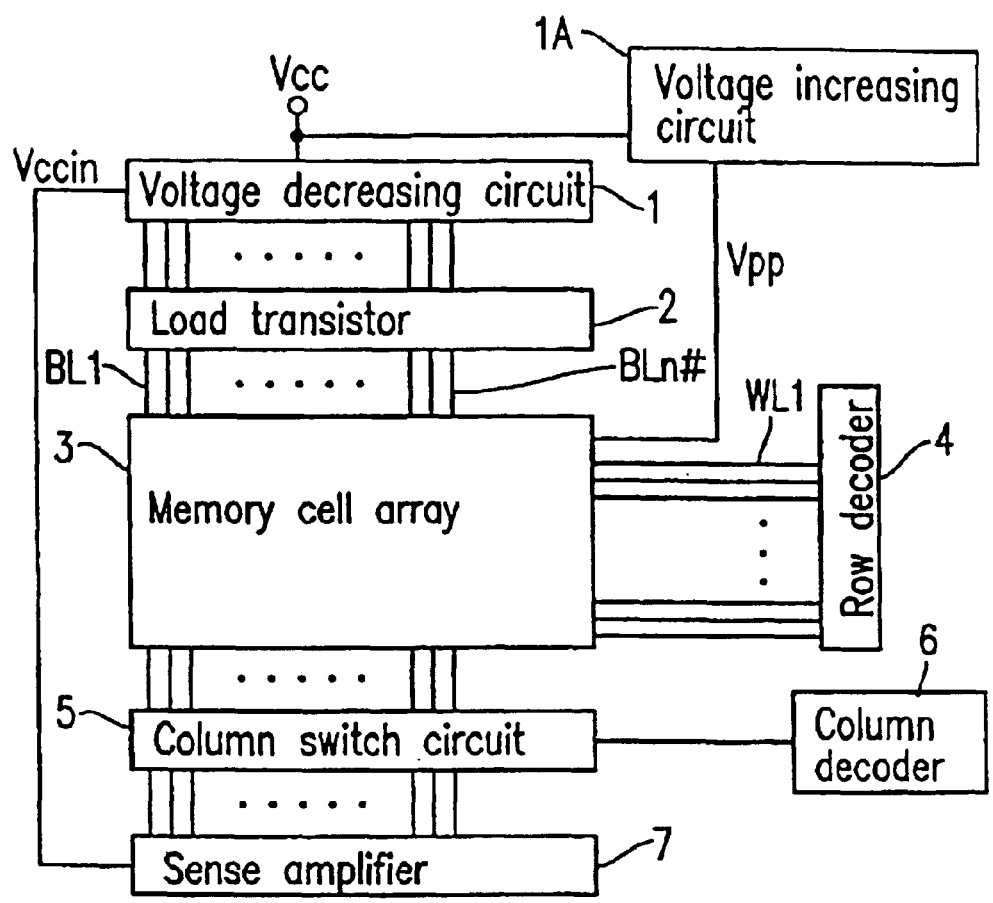
FIG. 14 is a block diagram showing another exemplary structure of the primary portion of the conventional static semiconductor storage device disclosed in Japanese Laid-Open Publication No. 8-69693.

The EQ circuit 13 is provided between the column switch circuit 5, which forms a column selection section, and the sense amplifier (amplification section) 7. The EQ circuit 13 receives electric power from the internal voltage decreasing circuit 11, and precharges and equalizes a pair of bit lines BLi/BLi# selected by the column switch circuit 5 which is turned on/off based on a column selection signal from the column decoder 6. The column selection section is formed by the column switch circuit 5 and the column decoder 6, and the row selection section is formed by the row decoder 4. In such an arrangement, the column switch circuit 5 is formed by a transfer circuit 5a as shown in FIG. 10. Sources and drains of the PMOS transistor P6 and the NMOS transistor N3 are respectively connected. An output of the column decoder 6 is connected to gates of the PMOS transistor P6 and the NMOS transistor N3. When only a gate of a column selected by the column decoder 6 becomes a high voltage level "High", the source-drain of these transistors are conducted. For example, in an information read operation, a transfer circuit 5a in a column switch circuit 5 which corresponds to a column selected according to an input address signal (not shown) is turned on, whereby the pair of complementary bit lines BLi/BLi#, which are connected to a selected memory cell 3a, are connected to the EQ circuit 13, and connected to both input terminals of the sense amplifier 7 via a pair of the complementary node lines SENi/SENi#.

The EQ circuit 14 is provided between the Vcc precharge circuit 12 and the memory cell array 3. The EQ circuit 14 receives electric power from the Vcc precharge circuit 12, and precharges and equalizes all of the pairs of complementary bit lines BL1/BL1# through BLn/BLn#.

The internal structure of each of the EQ circuit 13 and the EQ circuit 14 is formed by three PMOS transistors P3 to P5. An equalizing signal EQ# is input to each of the PMOS transistors P3 to P5, whereby precharge and equalizing control is performed.

An operation of the above structure performed in a read operation is described below.

At first, before reading information from a memory cell 3a to a pair of complementary bit lines BLi/BLi#, all of the pairs of complementary bit lines BL1/BL1# through BLn/BLn# are precharged with the precharge voltage Vpre by the Vcc precharge circuit 12 and equalized by the EQ circuit 14 regardless of selection/non-selection among the pairs of the complementary bit lines. On the other hand, the pair of the complementary node lines SENi/SENi# and the pair of complementary bit lines BLi/BLi# are precharged with electric power (precharge voltage Vpre; e.g., an intermediate potential Vcc/2) supplied from the internal voltage decreasing circuit 11 and equalized by the EQ circuit 13. Alternatively, only the pair of complementary bit lines BLi/BLi# selected by the column switch circuit 5 may be precharged and equalized. Still alternatively, all of the pairs of complementary bit lines BL1/BL1# through BLn/BLn# may be precharged and equalized regardless of selection/non-selection among the pairs of the complementary bit lines by the column switch circuit 5.

Next, a decode signal (row selection signal) from the row decoder 4 is sequentially input to the word lines WL1 to WLn in a selective manner. Thus, information stored in a memory cell 3a in the memory cell array 3 which is connected to a selected word line WLm is read out to all of the pairs of complementary bit lines BL1/BL1# through BLn/BLn#. The memory cell array 3 includes a plurality of columns (columns of memory cells 3a), and information stored in all of the memory cells 3a in a column connected to a selected word line is read out to each pair of complementary bit lines BLi/BLi# which extends in a column direction.

The decode signal (column selection signal) from the column decoder 6 is supplied to the column switch circuit 5. The column switch circuit 5 connects a predetermined pair of complementary bit lines BLi/BLi# to a corresponding pair of complementary node lines SENi/SENi# such that one column (a pair of bit lines) is selected among a plurality of columns. Thus, information stored in a specific memory cell 3a is read out through a specific pair of complementary node lines SENi/SENi#.

For example, in the case where a pair of complementary bit lines BLi/BLi# selected by the column switch circuit 5 is a pair of complementary bit lines BL1/BL1#, the pair of complementary bit lines BL1/BL1# is connected to a pair of complementary node lines SEN1/SEN1# by the column switch circuit 5. At this point in time, as described above, all of the pairs of complementary bit lines, which includes the pair of complementary bit lines BL1/BL1# and unselected pairs of complementary bit lines, have already been precharged by the Vcc precharge circuit 12 with the precharge voltage Vpre, and equalized. Furthermore, the pair of complementary bit lines BL1/BL1# have already been precharged by the internal voltage decreasing circuit 11 with the precharge voltage Vpre, and equalized.

In this way, in a state where an erroneous writing operation is prevented, information stored in a specific memory cell 3a is transferred to both inputs of the sense amplifier 7 via the pair of complementary node lines SENi/SENi#. The sense amplifier 7 amplifies a difference of the voltages of the pair of complementary node lines SENi/SENi#, and the amplified difference is output to an external circuit, whereby the information of the specific memory cell 3a is read out.

Thus, the pair of complementary bit lines BL1/BL1# connected to the selected memory cell 3a are precharged and equalized by the electric power supplied through two lines, i.e., the internal voltage decreasing circuit 11 and the Vcc precharge circuit 12. Therefore, the capacitance of a capacitor used in a stabilization circuit of the internal voltage decreasing circuit 11 is significantly decreased in comparison to the conventional internal voltage decreasing circuit 1 where precharging and equalizing are performed with a single line of voltage source. Furthermore, since it is not necessary to provide an output capacitor in the Vcc precharge circuit 12, the precharging and equalizing speed is increased, and accordingly, the speed of operations, such as a data read operation, a data write operation (an operation of precharging and equalizing bit lines before information is written from a pair of complementary bit lines to a memory cell), etc., is increased.

Furthermore, a load to be driven by the internal voltage decreasing circuit 11 is also significantly smaller in comparison to the conventional internal voltage decreasing circuit 1. Thus, a significantly smaller capacitance of a capacitor is sufficient. Furthermore, since it is not necessary to provide an output capacitor in the Vcc precharge circuit 12, an area on a semiconductor chip which is occupied by the internal voltage decreasing circuit 11 and the Vcc precharge circuit 12 can be significantly reduced in comparison to the conventional internal voltage decreasing circuit 1. Specifically calculating this chip area reduction effect, the chip area can be reduced to about a ⅙ thereof, because the area occupied by the capacitor is significantly reduced.

In the case where elements having a large electric current driving ability are used as the internal voltage decreasing circuit 11 and the Vcc precharge circuit 12, although the chip area for these elements are increased to some extent in comparison to the above example, the operational speed of a storage device can be increased with a smaller chip area in comparison to the conventional internal voltage decreasing circuit 1.

In the above described embodiment, the present invention is applied to a static semiconductor storage device (SRAM), but the application of the present invention is not limited to the SRAM. The present invention is also applicable to a dynamic semiconductor storage device (DRAM) or other type of semiconductor storage devices so long as the structure of the present invention can be used: wherein an internal voltage decreasing section is divided into a first voltage decreasing section and a second voltage decreasing section; an equalizing section is formed by a first equalizing section provided at one side of a memory cell array and a second equalizing section provided at the other side of the memory cell array: and the first equalizing section receives an electric power from the first voltage decreasing section, and the second equalizing section receives an electric power from the second voltage decreasing section. Further, a semiconductor storage device, such as a static semiconductor storage device, or the like, is integrally produced on a single chip.

Now, another exemplary structure of the internal voltage decreasing circuit 11 of the above embodiment (internal voltage decreasing circuit 11B shown in FIG. 5) is described. In the internal voltage decreasing circuit 11B, in order to suppress a "swing" of a reference potential (output intermediate potential Vcc/2) or noise, the first stage is formed by a small sized differential amplifier, and the second stage is formed by a large sized differential amplifier. Specifically, the internal voltage decreasing circuit 11B is formed by two stages of voltage decreasing sections, each of which includes: an output series circuit which extracts an output voltage from a connection point between a voltage decreasing driver section and a capacitor section (capacitance section); and a driver control section which amplifies a difference voltage between an output voltage of the output series circuit and a reference voltage (output intermediate potential Vcc/2) and controls the voltage decreasing driver section using the amplified output voltage. An output of the former stage voltage decreasing section is input to a reference voltage input terminal of the latter stage voltage decreasing section.

Figure 5:
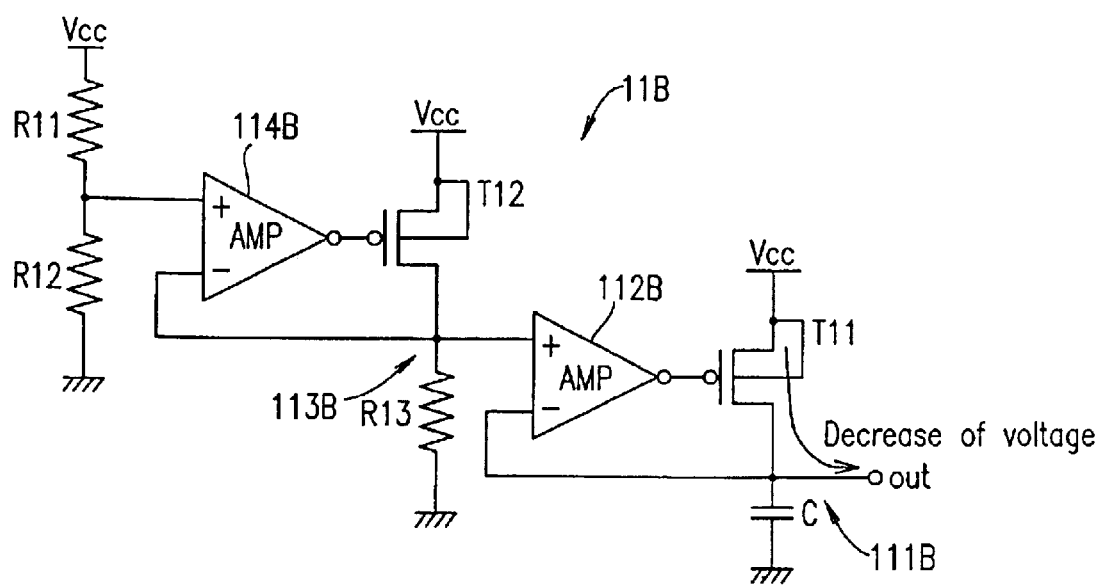
FIG. 5 is a circuit diagram showing another example of an internal voltage decreasing circuit of FIG. 1.

Specific connections of these elements are described with reference to FIG. 5. The internal voltage decreasing circuit 11B includes: a PMOS transistor (first voltage decreasing driver section) T11 provided between the power supply Vcc and a ground; a latter stage output series circuit 111B having a capacitor(capacitance section) C; a differential amplifier (driver control section) 112B where a connection point between the PMOS transistor T11 and the capacitor C is fed back to a negative input terminal, and an output terminal of the differential amplifier 112B is connected to a gate of the PMOS transistor T11: a PMOS transistor (second voltage decreasing driver section) T12 provided between the power supply Vcc and a ground; a former stage output series circuit 113B having a resistance R13; resistance sections R11 and R12 which are provided between the power supply Vcc and a ground and which are used for generating a reference voltage; and a differential amplifier (driver control section) 114B. In the differential amplifier 112B, a connection point between the PMOS transistor T11 and the capacitor C is fed back to a negative input terminal, and an output terminal of the differential amplifier 112B is connected to a gate of the PMOS transistor T11. In the differential amplifier 114B, a connection point between the resistance sections R11 and R12 is connected to a positive input terminal. A positive input terminal of the differential amplifier 112B, which is connected to a connection point between the PMOS transistor T12 and the resistance R13, is fed back to a negative input terminal. An output terminal of the differential amplifier 114B is connected to a gate of the PMOS transistor T12.

Figure 4:
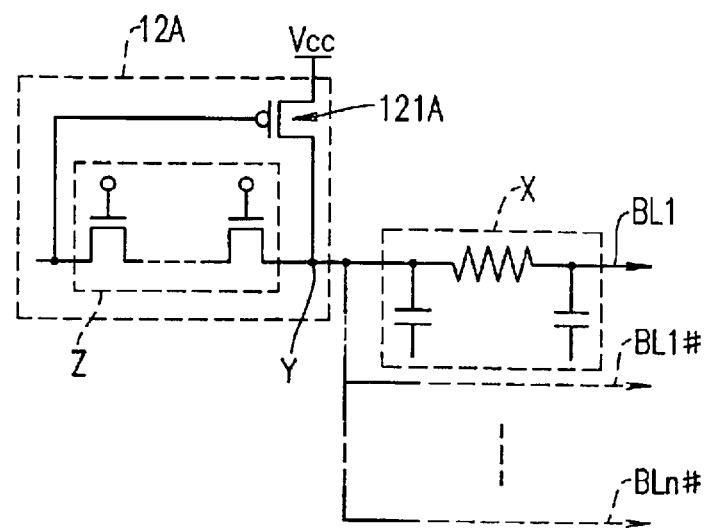
FIG. 4 is a circuit diagram showing an example of a Vcc precharge circuit of FIG. 1.
Figure 6:
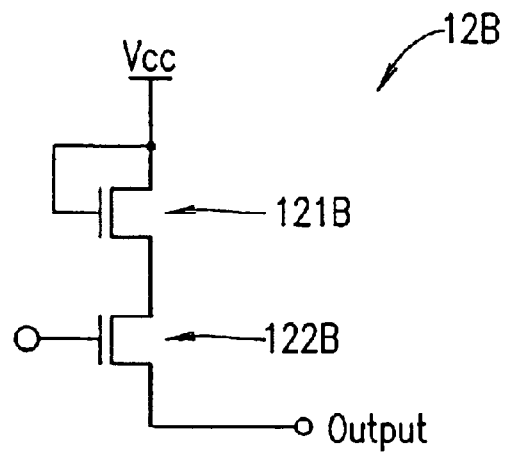
FIG. 6 is a circuit diagram showing another example of a Vcc precharge circuit of FIG. 1.

In this embodiment, as a specific example of a structure of the Vcc precharge circuit 12, the Vcc precharge circuit 12A shown in FIG. 4 has been described. However, the Vcc precharge circuit 12 is not limited to the Vcc precharge circuit 12A. The Vcc precharge circuit 12B may be structured more simply as shown in FIG. 6. A Vcc precharge circuit 12B of FIG. 6 is an exemplary circuit used exclusively for charging and having a most simplified structure. As shown in FIG. 6, the Vcc precharge circuit 12B has a series circuit used exclusively for charging, which is formed by a voltage decreasing transistor (voltage decreasing section) 121B and a charging transistor (charging section) 122B which is controlled by a switch. The Vcc precharge circuit 12B does not include a time constant circuit (equivalent circuit Z) shown in FIG. 4. Alternatively, the voltage decreasing driver section T121A of FIG. 4 may be formed by a series circuit exclusively used for charging, which includes a voltage decreasing transistor 121B and a charging transistor 122B.

Figure 7:
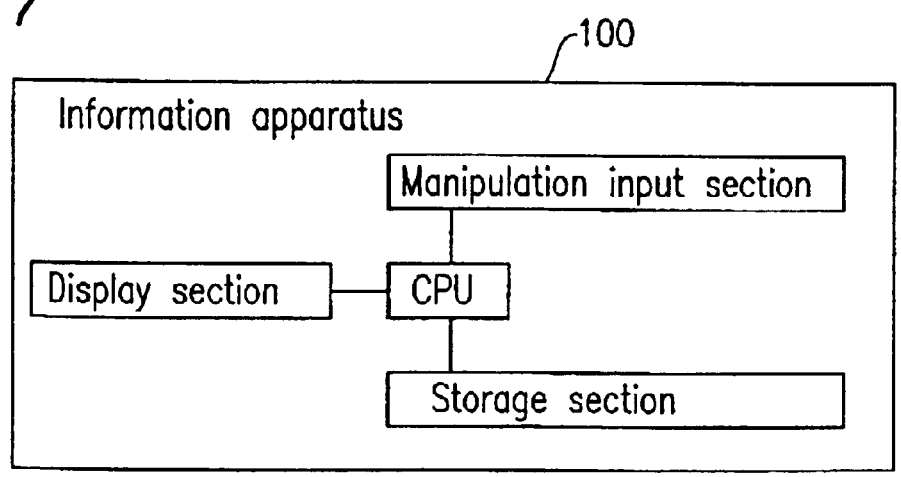
FIG. 7 is a block diagram showing a basic structure of an information apparatus which incorporates the static semiconductor storage device of FIG. 1.

In this embodiment, a static semiconductor storage device of the present invention has been described. The static semiconductor storage device of the present invention may be incorporated in an information apparatus, such as a portable phone, a computer, etc., so as to increase the speed of various memory operations (an information read operation or the like) while decreasing a semiconductor chip area. For example, an information apparatus 100 shown in FIG. 7 includes: an information storage section, such as an SRAM, an ROM, or the like; a manipulation input section; a display section for displaying an initial display, a result of information processing, etc., such as a liquid crystal display device; and a CPU (central processing unit) which receives a manipulation instruction from the manipulation input section and performs various information processes while reading/writing information in the information storage section based on a predetermined information processing program or data obtained therefrom. In the information apparatus having such a structure, a static semiconductor storage device of the present invention can be used as an SRAM of the information storage section.

As described above, by using a semiconductor storage device of the present invention, the size of a stabilization circuit which is provided for stabilizing an operation of a first voltage decreasing section, i.e., the capacitance of a capacitor, can be significantly reduced. Specifically, this stabilization circuit suppresses the electric current driving ability of the first voltage decreasing section, which is provided at one side of a memory cell array, at a low level, so as to prevent an influence of noise and a decrease in an output voltage level caused due to a temporal consumption of an electric current. Further, since it is not necessary to provide a stabilization circuit to a second voltage decreasing section, the chip size can be significantly reduced. Furthermore, precharging and equalizing of a pair of bit lines connected to a selected memory cell can be performed at a high speed. This can be achieved by the structure of the present invention, wherein pairs of complementary bit lines in columns connected to unselected memory cells are charged only by a second voltage decreasing section which is provided at the other side of the memory cell array, and accordingly, the amount of an electric current temporarily consumed by the second voltage decreasing section in a precharge and equalizing operation is reduced.

Furthermore, a pair of bit lines connected to a selected memory cell are precharged and equalized through two lines, i.e., the first voltage decreasing section, which is provided at one side of the memory cell array, and the second voltage decreasing section (a circuit exclusively used for charging), which is provided at the other side of the memory cell array. As described above, the chip size is significantly reduced, and therefore, the size of electric current driving elements which are included in the first and second voltage decreasing sections can be increased. As a result, an operational speed (precharge speed, reading/writing speed, etc.) can be further increased.

The above described effects of the present invention are especially significant in the field of semiconductor memories, where the level of the power supply voltage has been decreased especially in recent years.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor storage device, comprising:
   a memory cell array including a plurality of memory cells, the memory cells being connected to a plurality of pairs of complementary bit lines;
   a first voltage decreasing section for generating a predetermined voltage lower than a power supply voltage;
   a precharge circuit for generating a precharge voltage lower than the power supply voltage; and
   an equalizing section to which the predetermined voltage is supplied from the first voltage decreasing section and the precharge voltage from precharge circuit, and which performs an equalizing operation to charge the pairs of complementary bit lines to a predetermined equal potential before reading of information from the memory cells to the pairs of complementary bit lines, wherein
   the equalizing section is formed by a first equalizing section, which is provided at one side of the memory cell array, and a second equalizing section, which is provided at the other side of the memory cell array,
   the first voltage decreasing section supplies an electric power to the first equalizing section for equalizing a selected pair of complementary bit lines and their corresponding node lines, and
   the precharge circuit supplies an electric power to the second equalizing section for precharging the plurality of pairs of complementary bit lines.

2. The semiconductor storage device according to claim 1, further comprising:
   a row selection section for selecting, according to a row selection signal, memory cells in a specific row of the memory cell array which includes the plurality of memory cells connected to a plurality of pairs of complementary bit lines, and reading information from the specific memory cells to the plurality of pairs of complementary bit lines; and
   a column selection section for controlling a connection of a certain pair of complementary bit lines, which is selected among the plurality of pairs of complementmry bit lines according to a column selection signal, to an amplification section which is used for reading information from the memory cells,
   wherein the first equalizing section is provided between the column selection section and the amplification section.

3. The semiconductor storage device according to claim 2, wherein the first voltage decreasing section includes:
   an output series circuit for extracting an output voltage from a connection point between a first voltage decreasing driver section and a capacitor section; and
   a driver control section for amplifying a difference voltage between the output voltage and a reference voltage, and for controlling the first voltage decreasing driver section using the amplified output voltage.

4. The semiconductor storage device according to claim 2, wherein the first voltage decreasing section includes:
   a latter stage voltage decreasing section including
      a first output series circuit for extracting an output voltage from a connection point between a first voltage decreasing driver section and a capacitor section, and
      a first driver control section for amplifying a difference voltage between the output voltage and a first reference voltage, and for controlling the first voltage decreasing driver section using the amplified output voltage; and
   a former stage voltage decreasing section including
      a second output series circuit for employing an output voltage from a connection point between a second voltage decreasing driver section and a resistance section as the first reference voltage, and
      a second driver control section for amplifying a difference voltage between the first reference voltage and a second reference voltage, and for controlling the second voltage decreasing driver section using the amplified output voltage.

5. The semiconductor storage device according to claim 2, wherein the prechange circuit is formed by a circuit exclusively used for charging.

6. The semiconductor storage device according to claim 1, wherein among the first voltage decreasing sections and the precharge circuit, only the first voltage decreasing section has a stabilization circuit which is used for supply of an electric current.

7. The semiconductor storage device according to claim 6, wherein the capacitance of a capacitor section included in the stabilization circuit is smaller than that of a capacitor section included in the first voltage decreasing section.

8. The semiconductor storage device according to claim 7, wherein the first voltage decreasing section includes:
an output series circuit for extracting an output voltage from a connection point between a first voltage decreasing driver section and a capacitor section; and
a driver control section for amplifying a difference voltage between the output voltage and a reference voltage, and for controlling the first voltage decreasing driver section using the amplified output voltage.

9. The semiconductor storage device according to claim 7, wherein the first voltage decreasing section includes:
a latter stage voltage decreasing section including
a first output series circuit for extracting an output voltage from a connection point between a first voltage decreasing driver section and a capacitor section, and
a first driver control section for amplifying a difference voltage between the output voltage and a first reference voltage, and for controlling the first voltage decreasing driver section using the amplified output voltage; and
a former stage voltage decreasing section including
a second output series circuit for employing an output voltage from a connection point between a second voltage decreasing driver section and a resistance section as the first reference voltage, and
a second driver control section for amplifying a difference voltage between the first reference voltage and a second reference voltage, and for controlling the second voltage decreasing driver section using the amplified output voltage.

10. The semiconductor storage device according to claim 7, wherein the precharge circuit is formed by a circuit exclusively used for charging.

11. The semiconductor storage device according to claim 6, wherein the first voltage decreasing section includes:
an output series circuit for extracting an output voltage from a connection point between a first voltage decreasing driver section and a capacitor section; and
a driver control section for amplifying a difference voltage between the output voltage and a reference voltage, and for controlling the first voltage decreasing driver section using amplified output voltage.

12. The semiconductor storage device according to claim 6, wherein the first voltage decreasing section includes:
a latter stage voltage decreasing section including
a first output series circuit for extracting an output voltage from a connection point between a first voltage decreasing driver section and a capacitor section, and
a first driver control section for amplifying a difference voltage between the output voltage and a first reference voltage, and for controlling the first voltage decreasing driver section using the amplified output voltage; and
a former stage voltage decreasing section including
a second output series circuit for employing an output voltage from a connection point between a second voltage decreasing driver section and a resistance section as the first reference voltage, and
a second driver control section for amplifying a difference voltage between the first reference voltage and a second reference voltage, and for controlling the second voltage decreasing driver section using the amplified output voltage.

13. The semiconductor storage device according to claim 6, wherein the precharge circuit is formed by a circuit exclusively used for charging.

14. The semiconductor storage device according to claim 1, wherein the first voltage decreasing section includes:
an output series circuit for extracting an output voltage from a connection point between a first voltage decreasing driver section and a capacitor section; and
a driver control section for amplifying a difference voltage between the output voltage and a reference voltage, and for controlling the first voltage decreasing driver section using the amplified output voltage.

15. The semiconductor storage device according to claim 14, wherein the precharge circuit is formed by a circuit exclusively used for charging.

16. The semiconductor storage device according to claim 1, wherein the first voltage decreasing section includes:
a latter stage voltage decreasing section including
a first output series circuit for extracting an output voltage from a connection point between a first voltage decreasing driver section and a capacitor section, and
a first driver control section for amplifying a difference voltage between the output voltage and a first reference voltage, and for controlling the first voltage decreasing driver section using the amplified output voltage; and
a former stage voltage decreasing section including
a second output series circuit for employing an output voltage from a connection point between a second voltage decreasing driver section and a resistance section as the first reference voltage, and
a second driver control section for amplifying a difference voltage between the first reference voltage and a second reference voltage, and for controlling the second voltage decreasing driver section using the amplified output voltage.

17. The semiconductor storage device according to claim 16, wherein the precharge circuit is formed by a circuit exclusively used for charging.

18. The semiconductor storage device according to claim 1, wherein the precharge circuit is formed by a circuit exclusively used for charging.

19. The semiconductor storage device according to claim 18, wherein the circuit exclusively used for charging includes:
a third voltage decreasing driver section for charging the bit lines; and
a driver control section for monitoring a bit line voltage charged by the third voltage decreasing driver, and for controlling the third voltage decreasing driver section such that charging is stopped when the bit line voltage reaches a predetermined bit line voltage.

20. An information apparatus which performs a memory processing operation using the semiconductor storage device recited in claim 1.

* * * * *